(12) United States Patent
Jacobs

(10) Patent No.: US 6,822,463 B1
(45) Date of Patent: Nov. 23, 2004

(54) ACTIVE DIFFERENTIAL TEST PROBE WITH A TRANSMISSION LINE INPUT STRUCTURE

(75) Inventor: Lawrence W. Jacobs, Beaverton, OR (US)

(73) Assignee: LeCroy Corporation, Chestnut Ridge, NY (US)

( * ) Notice: Subject to any disclaimer, the term of this patent is extended or adjusted under 35 U.S.C. 154(b) by 28 days.

(21) Appl. No.: 10/261,829

(22) Filed: Sep. 30, 2002

Related U.S. Application Data

(60) Provisional application No. 60/342,974, filed on Dec. 21, 2001.

(51) Int. Cl.[7] ............................................... G01R 27/08
(52) U.S. Cl. ...................................... 324/715; 324/72.5
(58) Field of Search ............................ 324/72.5, 158.1, 324/715, 754

(56) References Cited

U.S. PATENT DOCUMENTS

| | | | |
|---|---|---|---|
| 3,532,982 A | 10/1970 | Zeidhack et al. | |
| 3,870,953 A | 3/1975 | Boatman et al. | |
| 4,055,805 A | 10/1977 | Ardezzone | |
| 4,132,946 A | 1/1979 | Holdren et al. | |
| 4,195,258 A | 3/1980 | Yen | |
| 4,574,235 A | 3/1986 | Kelly et al. | |
| 4,740,746 A | 4/1988 | Pollock et al. | |
| 4,743,839 A | 5/1988 | Rush | |
| 4,856,023 A | * 8/1989 | Singh | 375/212 |
| 4,908,576 A | * 3/1990 | Jackson | 324/754 |
| 4,923,407 A | 5/1990 | Rice et al. | |
| 5,115,200 A | 5/1992 | Lahitte et al. | |
| 5,287,065 A | 2/1994 | Allfather | |
| 5,386,197 A | 1/1995 | Saito | |
| 6,201,459 B1 | 3/2001 | Ioffe et al. | |
| 6,276,956 B1 | 8/2001 | Cook | |
| 6,307,363 B1 | 10/2001 | Anderson | |
| 6,307,389 B1 | 10/2001 | Buks et al. | |
| 6,483,284 B1 | 11/2002 | Eskeldson et al. | |
| 6,670,830 B2 * | 12/2003 | Otsuka et al. | 326/88 |
| 6,688,906 B2 | 2/2004 | Kimbley | |
| 6,704,670 B2 | 3/2004 | McTigue | |

OTHER PUBLICATIONS

P6511/P6513/P6515/P6517, Tek Spring Contact Fixtured Probes, Tektronix Catalog, 1989.
Digital Signal Transmission, Digital Circuits and Systems, 1989, pp. 292–297, McGraw–Hill, Inc., United States.
Aglient Technologies, "Aglient EPM Series Power Meters E–Series and 8480 Series Power Sensors Data Sheet," at least as early as Oct. 24, 2003, pp. 1–22, www.aglient.com.

\* cited by examiner

*Primary Examiner*—Anjan Deb
*Assistant Examiner*—Timothy J. Dole
(74) *Attorney, Agent, or Firm*—Karen Dana Oster

(57) ABSTRACT

An active differential test probe with a transmission line input structure. The test probe includes a differential amplifier, a plurality of transmission line signal conductors that are coupled between the differential amplifier and test points where electrical signals can be sampled, and a plurality of transmission line ground conductors that are coupled to the differential amplifier and floating at their opposite end.

26 Claims, 7 Drawing Sheets

ACTIVE DIFFERENTIAL TEST PROBE WITH A TRANSMISSION LINE INPUT STRUCTURE

The present application is a nonprovisional of U.S. Provisional Patent Application Ser. No. 60/342,974, filed Dec. 21, 2001. The present application is based on and claims priority from these applications, the disclosures of which are hereby incorporated herein by reference.

BACKGROUND OF INVENTION

The present invention relates to the field of electrical test probes. More particularly, the present invention relates to an active differential test probe with a transmission line input structure.

An electrical signal will change when a test instrument, such as an oscilloscope, is connected to the circuit that generates the signal. For example, if a bare wire is connected between a circuit and an oscilloscope, the wire and the input circuitry of the oscilloscope effectively add a load resistance and a shunt capacitance to the circuit. This reduces the measured voltage and affects measurements of dynamic timing characteristics, such as pulse rise time. For this reason, a test probe that minimizes the loading effects on the circuit is generally used when a test instrument is connected to a circuit. Several general types of test probes have been developed.

With a high-impedance test probe, it is possible to take a small sample of the signal without appreciably loading the circuit being measured. A high-impedance test probe consists of a large value resistor and an input capacitor coupled, in parallel, to a test point in the circuit. A high-impedance test probe, however, is not suited for high-frequency measurements because of the relatively high value of its input capacitance.

A low-impedance test probe is better suited for measurement of high frequency signals. A low-impedance test probe consists of a low-value input resistor in series with the signal conductor of a low-loss coaxial cable that is treated as a terminated transmission line. One limitation of the low-impedance test probe is that it may be used only at a test point with a relatively low source resistance. Another disadvantage is that the low-impedance test probe is a single ended test probe. An additional limitation of the low-impedance test probe is that the frequency is limited to the resonant frequency of the probe input capacitance in series with the ground lead inductance.

An active test probe represents another approach for obtaining accurate measurements of high frequency signals. An active test probe includes a resistive/capacitive divider network coupled between a test point and an amplifier with a high input impedance. One limitation of the active test probe, however, is that it is not possible to design an amplifier with the required high input impedance at very high frequencies. Another limitation of the active test probe is that high frequency signals can be distorted because of electromagnetic wave reflection. This signal distortion results from the fact that as frequency increases, the input structure becomes large with respect to the electrical wavelength.

The active test probe design has additional limitations when it is used in differential test probes. A differential test probe measures two signals and outputs a third signal representing the difference between the first signal and the second signal. An active differential test probe consists of two resistive/capacitive divider networks, one for each signal to be measured, and a differential amplifier. To function properly the two divider networks of the differential test probe must be accurately matched. In practice, however, the difficulty of properly matching the two divider networks can be a significant limitation. Another limitation is that high frequency signal distortion from electromagnetic wave reflection can be a significant problem when sampling two spaced-apart test points. In this situation, it may be physically impossible to keep the input structures small with respect to the electrical wavelength.

As mentioned above, a differential probe measures the difference between two input signals. For this purpose, two probe tips are needed. Most prior art dual tip systems are plug-in devices. In order to adjust the distance between the two tips, the tips are able to slide or swivel. The problem with these systems is that the tips often slide or swivel by themselves when the user does not want them to move.

Accordingly, there is a need for an active differential test probe with a transmission line input structure that does not require a high impedance amplifier, matched input networks, and small input structures.

BRIEF SUMMARY OF THE INVENTION

The invention disclosed herein is an active differential electrical test probe with an exemplary transmission line input structure. More particularly, the present invention is an electrical test probe for sensing a plurality of electric signals and generating a differential signal. The test probe includes a first transmission line, a second transmission line, and a differential amplifier. The first transmission line has a first signal conductor, a first ground conductor, and a characteristic impedance of a first predetermined value. The second transmission line has a second signal conductor, a second ground conductor, and a characteristic impedance of a second predetermined value. The differential amplifier has a first signal input, a second signal input, and a ground input. The first signal input has a first input resistance that is substantially equal to the first predetermined value. In addition, the second signal input has a second input resistance that is substantially equal to the second predetermined value. A first end of the first signal conductor is coupled to the first signal input and a first end of the first ground conductor is coupled to the ground input. A first end of the second signal conductor is coupled to the second signal input and a first end of the second ground conductor is coupled to the ground input. A second end of the first signal conductor is coupled to a first test point and a second end of the first ground conductor is left floating. A second end of the second signal conductor is coupled to the second test point and a second end of the second ground conductor is left floating.

In one preferred embodiment, the test probe includes a first resistor and a second resistor. The first resistor is coupled in series between the second end of the first signal conductor and the first test point. The second resistor is coupled in series between the second end of the second signal conductor and the second test point.

The foregoing and other objectives, features, and advantages of the invention will be more readily understood upon consideration of the following detailed description of the invention, taken in conjunction with the accompanying drawings.

DETAILED DESCRIPTION OF THE INVENTION

Figure 5:
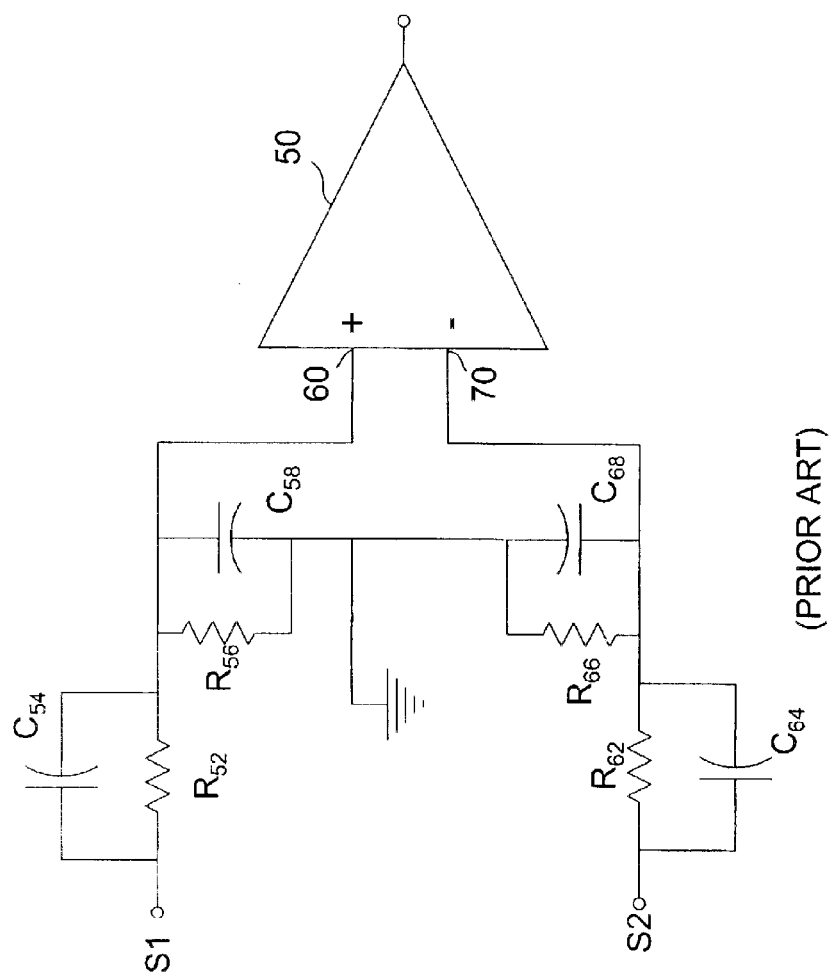
FIG. 5 is a circuit diagram of an exemplary prior art active differential test probe.
Figure 6:
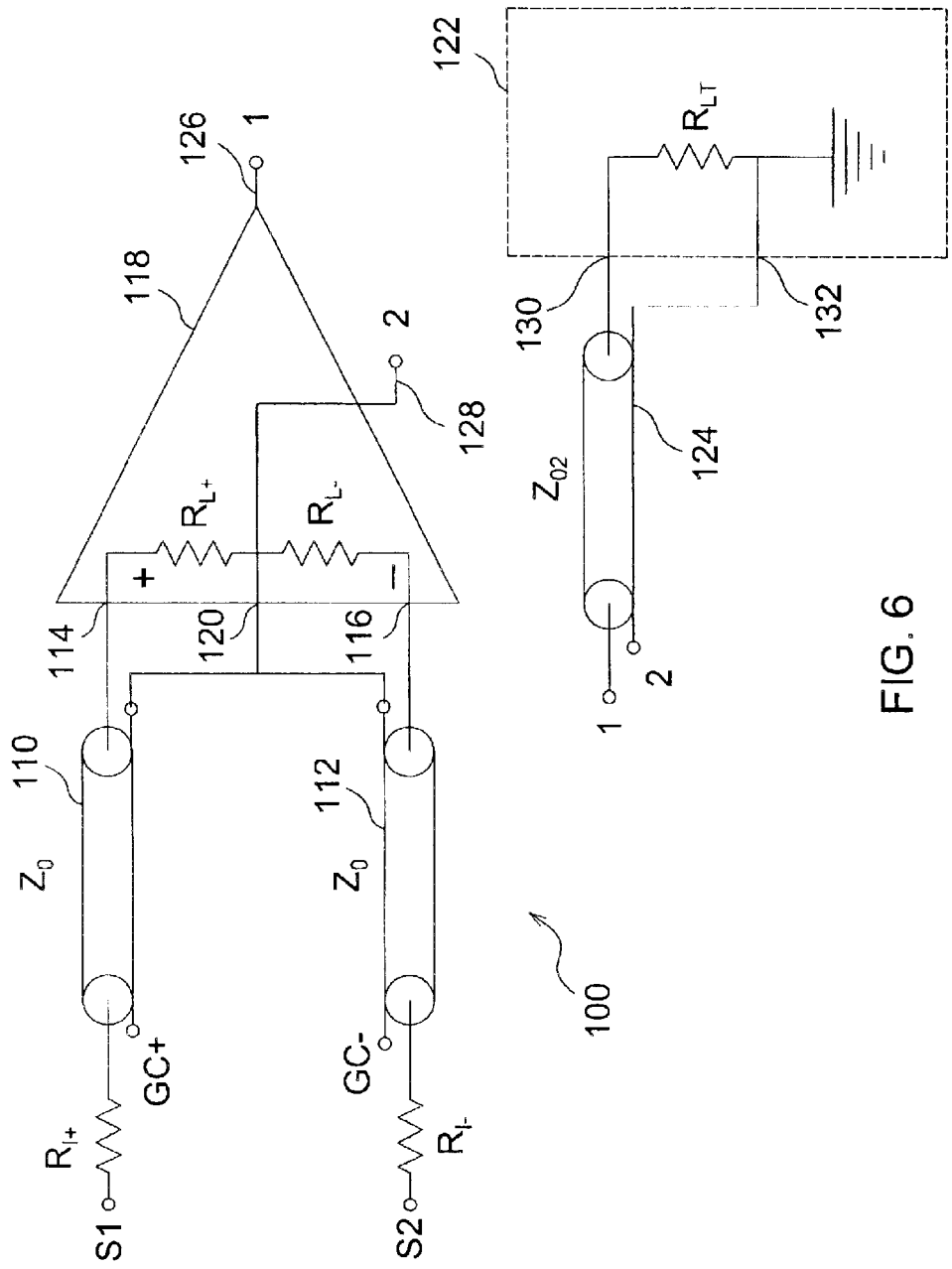
FIG. 6 is a circuit diagram of an active differential test probe with an exemplary transmission line input structure according to the present invention coupled to an exemplary test instrument.
Figure 7:
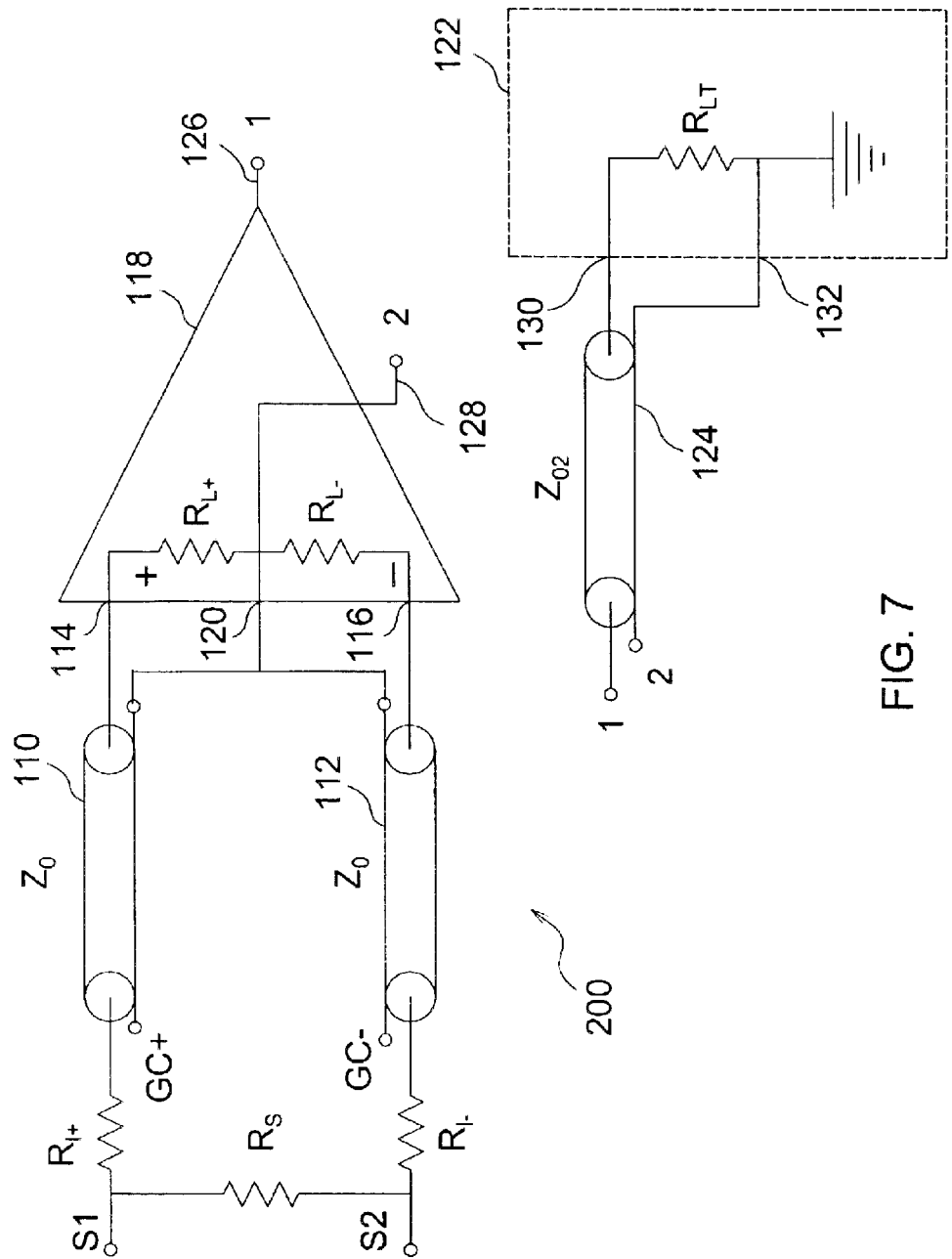
FIG. 7 is a circuit diagram of an active differential test probe of the present invention that may be used to measure current.
Figure 8:
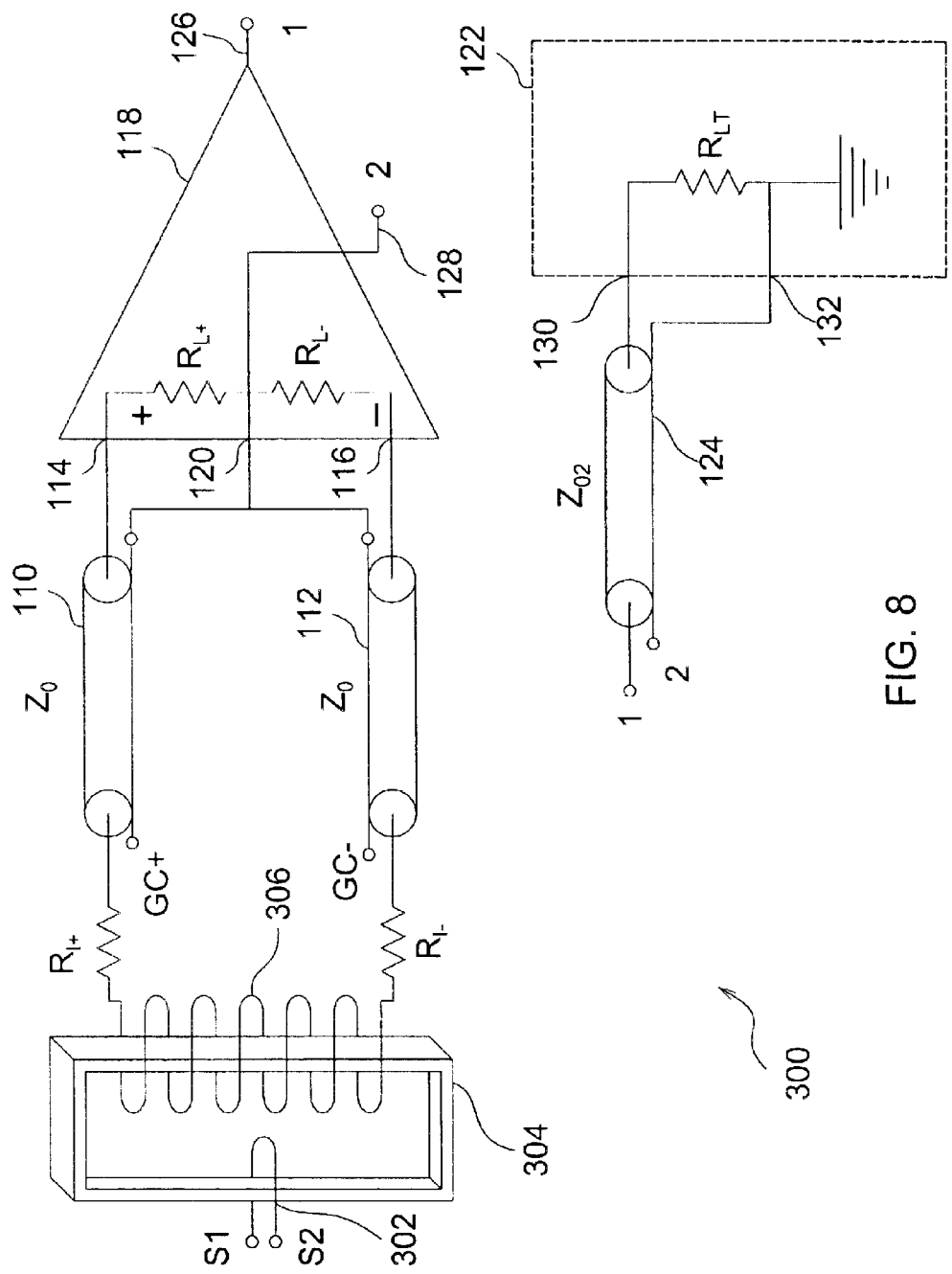
FIG. 8 is a circuit diagram of an active differential test probe of the present invention that may be used to measure AC current flowing in a first conductor.

The present invention is directed to an active differential test probe with a transmission line input structure. The test probe of the present invention is advantageously described with reference to prior art test probes. FIGS. 2–5 depict several prior art test probes. FIGS. 6–8 illustrate exemplary test probes of the present invention.

Figure 1:
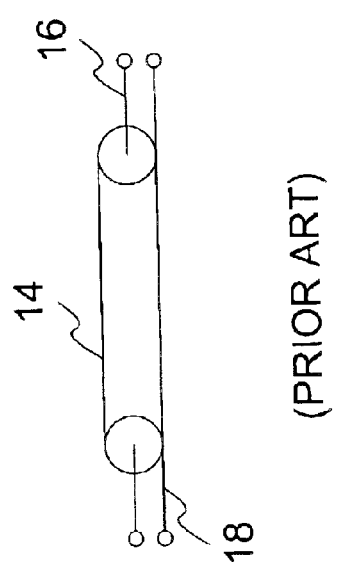
FIG. 1 is a circuit diagram of an exemplary prior art transmission line.

Throughout this application, reference is made to the signal conductor and the ground conductor of various transmission lines. FIG. 1 is a circuit diagram that illustrates an exemplary transmission line 14. The exemplary transmission line 14 includes a signal conductor 16 and a ground conductor 18. FIG. 1 illustrates how the signal conductor and the ground conductor of a transmission line are depicted in the remaining figures. As will be apparent to one skilled in the art, however, the transmission line may be a printed transmission line (e.g. microstrip or strip line), coaxial cable, or any structure that has a constant impedance.

The exemplary transmission line 14 of FIG. 1 includes two or more parallel conductors 16, 18 (e.g. parallel wires, parallel plates, a coaxial line, a strip line, or other structure with two or more conductors within which electromagnetic waves can be guided). A typical transmission line has a signal conductor 16 and a ground conductor 18. A lossless transmission line has a characteristic impedance that has a fixed value irrespective of the length of the line. A low-loss transmission line can be used to approximate the properties of a lossless transmission line. At high frequency, signals can be distorted as the result of electromagnetic wave reflection. If a transmission line is terminated with its characteristic impedance, the distortion due to signal reflection can be eliminated.

Figure 2:
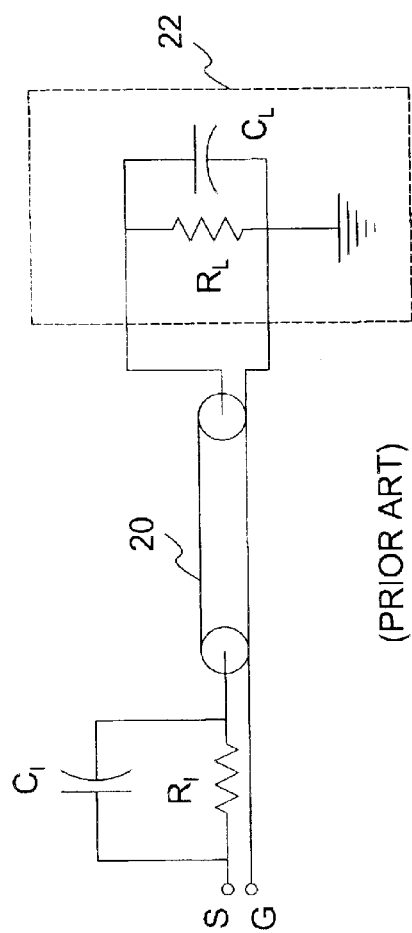
FIG. 2 is a circuit diagram of an exemplary prior art high-impedance test probe coupled to an exemplary test instrument.

FIG. 2 illustrates an exemplary prior art high-impedance test probe that consists of an input resistor $R_I$ and a compensating capacitor $C_I$ that are coupled, in parallel, to a signal test point S. The signal conductor of the transmission line 20 couples the resistor $R_I$ and the compensating capacitor C, to the signal input of a test instrument 22. In addition, the ground conductor of the transmission line 20 couples a signal ground point G to the ground input of the test instrument 22. The input circuitry of the test instrument 22 includes a resistor $R_L$ and a capacitor $C_L$ that are coupled in parallel between the signal input and the ground input of the test instrument 22. The input resistor $R_I$ and the resistance of the transmission line 20 form a voltage divider with resistor $R_L$.

The large value input resistor $R_I$ of the high-impedance test probe of FIG. 2 makes it possible to take a small sample of the signal without appreciably loading the circuit being measured. The input compensating capacitor $C_I$ compensates for the shunt capacitance in the oscilloscope input circuitry. While the high-impedance test probe allows a signal to be measured without loading down the circuit, it is not suited for high-frequency measurements because of the relatively high value of its input capacitance $C_I$. This is because the reactance of the input capacitor C, declines to zero at high frequencies (because capacitive reactance declines in inverse proportion to both signal frequency and the size of the capacitance).

Figure 3:
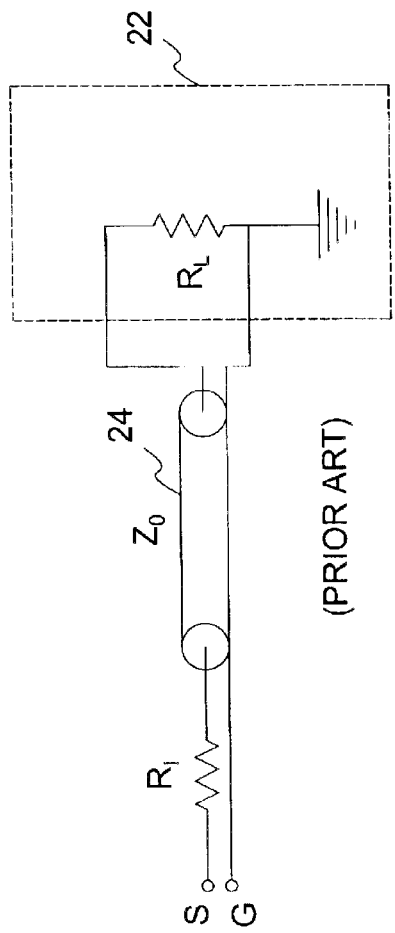
FIG. 3 is a circuit diagram of an exemplary prior art low-impedance test probe coupled to an exemplary test instrument.

FIG. 3 illustrates an exemplary prior art low-impedance test probe that consists of an input resistor $R_I$ in series with a low-loss transmission line 24 that is coupled to a test instrument 22. The input resistor $R_I$ is coupled to a signal test point S and the ground conductor of the cable 24 is coupled to a signal ground point G. The input circuitry of the test instrument 22 includes a termination resistor $R_L$. The cable 24 has a characteristic impedance $Z_0$ that is equal to the resistance of the termination resistor $R_L$.

The low-impedance test probe shown in FIG. 3 relies on the principle of terminated transmission line behavior to obtain accurate measurements of high frequency signals. The low-loss transmission line 24 shown in FIG. 3 is treated as a terminated transmission line. To terminate the transmission line 24, the low-impedance test probe must be used with a test instrument 22 that has an input termination resistor $R_L$ that matches the characteristic impedance of the transmission line 24. The low-impedance test probe also includes an input capacitance (not shown in the FIG. 3) that is inherent in the probe structure, but this capacitance is relatively small.

In a low-impedance test probe, if the value of the input resistor $R_I$ is sufficiently large with respect to the Thevenin equivalent source resistance of the circuit, a measurement of acceptable accuracy may be obtained. For example, a low-impedance test probe including a 450 ohm resistor $R_I$ and a 50 ohm transmission line 24 will produce acceptable measurements when coupled to a test point with a source resistance of 50 ohms. One limitation of the low-impedance test probe is that it may be used only at a test point with a relatively low source resistance. For example, under certain circumstances, if the source resistance of the circuit increases to only 120 ohms, the accuracy of the measured signal is significantly reduced and the circuit no longer operates correctly. As mentioned, the input capacitance of the low-impedance test probe is relatively small. This means that the input impedance does not fall off with increasing frequency as rapidly as with high-impedance probes. Eventually, however, the impedance of the low-impedance test probe does fall off with increasing frequency. Low-impedance test probes can be used successfully at considerably higher frequencies than high-impedance probes.

Figure 4:
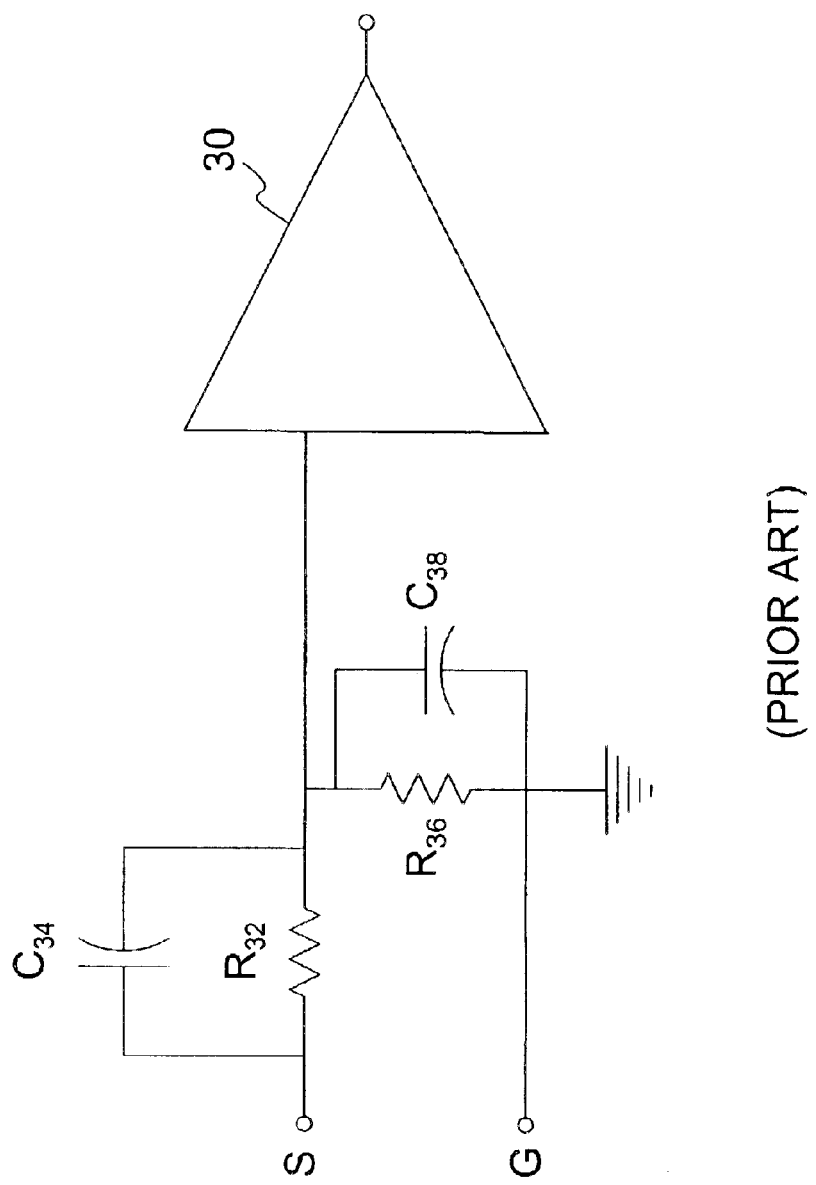
FIG. 4 is a circuit diagram of an exemplary prior art active test probe.

FIG. 4 illustrates an exemplary prior art active test probe that consists of a resistive/capacitive divider network coupled to an amplifier 30. The divider network includes a first resistor $R_{32}$ and a first capacitor $C_{34}$ coupled, in parallel, between a signal test point S and the input of the amplifier 30. The input network also includes a second resistor $R_{36}$ and a second capacitor $C_{38}$ coupled, in parallel, to the input of the amplifier 30 and shunted to ground. A signal ground point G is coupled to the ground of the divider network.

In the active test probe shown in FIG. 4, the first resistor-capacitor pair ($R_{32}$ and $C_{34}$) and the second resistor-capacitor pair ($R_{36}$ and $C_{38}$) form a divider that attenuates the signal and compensates for parasitic effects that the amplifier would otherwise place on the circuit. The amplifier 30 must have high input impedance so that the active test probe does not load the circuit. The impedance of the amplifier 30 is frequency dependent, however, and a limitation of the active test probe is that an amplifier 30 with the required high input impedance at very high frequencies is not readily available. Another limitation of the active test probe is that as frequency increases, the input structure (i.e., the resistive/capacitive divider network and other components, such as the probe tip) becomes large with respect to the electrical wavelength. In situations where the frequency is high enough so that the input structure is large with respect to the wavelength, signals will be distorted as the result of electromagnetic wave reflection. The input structure, therefore, must be kept small with respect to the electrical wavelength and the amplifier 30 must be situated as close as possible to the signal test point S.

As previously indicated, the active test probe design may be used in differential test probes. FIG. 5 illustrates an exemplary prior art active differential test probe having two resistive/capacitive divider networks, one for each signal to be measured, and a differential amplifier 50. The first divider network includes a first resistor $R_{52}$ and a first capacitor $C_{54}$ coupled, in parallel, between a first signal test point S1 and a first input 60 of the differential amplifier 50. The first divider network also includes a second resistor $R_{56}$ and a second capacitor $C_{58}$ coupled, in parallel, to the first input 60 of the differential amplifier 50 and shunted to ground. Similarly, the second divider network includes a first resistor $R_{62}$ and a first capacitor $C_{64}$ coupled, in parallel, between a second signal test point S2 and a second input 70 of the differential amplifier 50. The second divider network also includes a second resistor $R_{66}$ and a second capacitor $C_{68}$ coupled, in parallel, to the second input 70 of the differential amplifier 50 and shunted to ground.

To obtain an accurate measurement of the difference between the two measured signals S1 and S2 with the active differential test probe shown in FIG. 5, the components in the two divider networks must be accurately matched. In other words, each divider network must provide the same amount of attenuation and compensation. In practice, however, it can be difficult to properly match the components of the two divider networks. Further, as mentioned, a limitation of active test probes is that the input structure must be small relative the wavelength and the amplifier must be situated as close as possible to the signal test point. This limitation is especially problematic in situations such as that shown in which the two test points S1 and S2 may not be physically adjacent in the circuit under test. In other words, it may not be physically possible to keep both the input structure small and the amplifier 50 close to spaced-apart test points S1 and S2.

Having described the prior art test probes shown in FIGS. 2–5, an active differential test probe with a transmission line input structure 100 according to the present invention will be shown in FIGS. 6–8 and described below.

Turning to FIG. 6, the test probe 100 includes first and second resistors $R_{I+}$, $R_{I-}$, first and second transmission line structures 110, 112, and a differential amplifier 118. Each of the transmission line structures 110, 112 has a signal conductor and a ground conductor. The differential amplifier 118 has a first signal input 114, a second signal input 116, a ground input 120, and a differential output 126.

As shown in FIG. 6, the first resistor $R_{I+}$ is coupled between a first signal test point S1 and the signal conductor of the first transmission line structure 110. At the end GC+, where the signal conductor of the first transmission line structure 110 is coupled with the first resistor $R_{I+}$, the ground return conductor of the first transmission line 110 is left uncoupled ("floating"). At an end opposite first resistor $R_{I+}$, the signal conductor of the first transmission line structure 110 is coupled to the first signal input 114 of the differential amplifier 118 and the ground return conductor of the first transmission line 110 is coupled to the ground input 120.

Similarly, the second resistor $R_{I-}$ is coupled between a second signal test point S2 and the signal conductor of the second transmission line structure 112. At the end GC-, where the signal conductor of the second transmission line structure 112 is coupled with the second resistor $R_{I-}$, the ground return conductor of the second transmission line 112 is left floating. At an end opposite second resistor $R_{I-}$ the signal conductor of the second transmission line structure 112 is coupled to the second signal input 116 of the differential amplifier 118 and the ground return conductor of the second transmission line 112 is coupled to the ground input 120.

The first and second signal inputs 114, 116 of the differential amplifier 118 each have an input resistance that may be modeled and represented symbolically, as shown in FIG. 6 and referred to hereinafter, by termination resistors $R_{L+}$, $R_{L-}$. It will be appreciated by one skilled in the art that the differential amplifier 118 preferably does not, in fact, include termination resistors $R_{L+}$, $R_{L-}$. Rather, the differential amplifier 118 includes an input circuit including resistors, capacitors, and transistors that, in combination, have input impedances with respect to ground that are equivalent to the shown termination resistors $R_{L+}$, $R_{L-}$. As shown in FIG. 6, termination resistor $R_{L+}$ is coupled in series between the first signal input 114 and the ground input 120. Similarly, termination resistor $R_{L-}$ is coupled in series between the second signal input 116 and the ground input 120.

The resistive values of termination resistors $R_{L+}$, $R_{L-}$ are such that they match the characteristic impedances $Z_0$ of the first and second transmission line structures 110, 112. In addition, the first and second transmission line structures 110, 112 have characteristic impedances $Z_0$ and electrical lengths that are substantially identical. In one preferred embodiment, the first and second transmission line structures 110, 112 are strip line structures. In an alternative preferred embodiment, the first and second transmission line structures 110, 112 are coaxial cables.

One advantage of the present invention, therefore, may be that it is relatively easy to accomplish the design of differential amplifier 118 with input resistances $R_{L+}$, $R_{L-}$ having values that match the characteristic impedances $Z_0$ of the first and second transmission line structures 110, 112.

FIG. 6 also shows a test instrument 122 and a coaxial cable transmission line 124 coupling the test probe 100 to the test instrument 122 at points 1, 2. The cable 124 has signal conductor, a ground conductor, and a characteristic impedance $Z_{O2}$. At a first end of cable 124, the signal conductor is coupled to a differential output 126 of the differential amplifier 118 and the ground conductor is coupled to a ground output 128. At its opposite end, the signal conductor of the cable 124 is coupled to a signal input 130 of the test instrument 122 and the ground conductor of the cable 124 is coupled to a ground input 132 of the test instrument 122. The test instrument 122 includes a termination resistor $R_{LT}$ that is coupled in series between the signal input 130 and the ground input 132. The resistive value of the termination resistor $R_{LT}$ is equal to the characteristic impedance $Z_{02}$ of the cable 124.

FIG. 7 shows an alternative embodiment of the present invention that may be used to measure current. The test probe 200 shown in this figure is similar to the test probe 100 shown in FIG. 6 and like elements are denoted by like reference numbers. The test probe 200 further includes a shunt resistor $R_S$ that is coupled between the first resistor $R_{I-}$ at and end near the first signal test point S1 and the second resistor $R_{I-}$ at an end near the second signal test point S2. The shunt resistor $R_S$ preferably has a small resistive value. The voltage at the differential output 126 is proportional to the current in the shunt resistor $R_S$.

FIG. 8 illustrates yet another embodiment of a test probe according to the present invention that may be used to measure AC current flowing in a first conductor 302. The test probe 300 shown in this figure is similar to the test probe 100 shown in FIG. 6 and like elements are denoted with like reference numbers. The test probe 300 further includes a magnetic core 304 and a second conductor 306. The current to be measured flows between test points S1 and S2 in first conductor 302. As shown in FIG. 8, the first conductor 302 passes though the magnetic core 304. The second conductor 306 is wound at least one time around at least one section of the magnetic core 304. In addition, the second conductor 306 is coupled between the first resistor $R_{I+}$ at an end of opposite the first transmission line structure 110 and the second resistor $R_{I-}$ at an end opposite the second transmission line structure 112. It will be appreciated that DC capability could be added to the test probe shown in FIG. 8 by employing known "bucking" techniques.

In yet another additional alternate embodiment, the current may be measured using the test probe shown in FIG. 6 where the impedance between test points S1 and S2 in the circuit under test is known.

The test probes of the present invention solve the problems inherent in the prior art test probes. Because the input structure is a terminated transmission line, the input structure does not need to be small with respect to the electrical wavelength and the amplifier does not need to be as dose as possible to the input structure. The first and second transmission line structures 110,112 can be any reasonable length and the amplifier may be situated remotely from the signal test points S1, S2. (The input structure has a reasonable length so long as the input structure approximates a lossless transmission line.) This results in considerable ease and flexibility when simultaneously sampling a plurality of signals. Further, the test probes of the present invention do not require two resistor/capacitor divider networks, nor do they require matching the components of the two divider networks. The present invention only requires that: (1) the input structures have characteristic impedances and electrical length that are substantially the same, and (2) the resistors between the test points and the transmission line structures have resistive values that are substantially the same. Practically, this is much easier to achieve than matching the components in the resistor/capacitor divider networks. Moreover, the test probe 100 does not require a differential amplifier with a high input impedance value thereby simplifying amplifier design and permitting the use of the test probe of the present invention at higher frequencies than are possible with an active test probe.

While the transmission lines of the test probes of the present invention have been described in terms of a strip line, it will be appreciated that any form of transmission line may be used, such as coaxial cable, parallel plates, or parallel wires. In addition, while the present invention has been described in terms of differential test probe with two signal inputs, it will be appreciated that the present invention may be practiced with a single signal input or with three or more signal inputs. Moreover, while the test probes of the present invention have been described as having first and second resistors $R_{I+}$, $R_{I-}$, it will be appreciated that the resistors may have any suitable resistive value.

Although the present invention may be implemented with prior art dual tip systems, the present invention may be implemented with a unique dual tip system that includes a control mechanism (e.g. a ratchet slider or a friction system) for controlled placement of the dual probe tips. It should be noted that any control mechanism that allows controlled movement between the dual probe tips could function as a control mechanism. Still further, it should be noted that the dual tip system may be implemented as a plug in unit or as a unit integrated into a probing head. The dual tip system may include one movable probe tip and one fixed probe tip. Alternatively, the dual tip system may include two movable probe tips. Any of the embodiments of the dual tip system may be implemented using a movable/fixed or dual movable movement system. The probe tips of the dual tip system may be connected together at the back ends or they may be separately controlled. In alternative embodiments the probe tips cross at the back and are controlled through the intersection thereof. The probe tips may swivel about respective points or may slide in relation to each other. The probe tips may be held in position relative to each other by a control mechanism (e.g. a ratchet slider or a friction system). Alternative embodiments may include a locking structure to hold the dual probe tips in place. These configurations of the dual tip system are meant to be exemplary and are not meant to limit the scope of the invention.

The terms and expressions that have been employed in the foregoing specification are used as terms of description and not of limitation, and are not intended to exclude equivalents of the features shown and described or portions of them. The scope of the invention is defined and limited only by the claims that follow.

What is claimed is:

1. An electrical test probe for sensing a plurality of electric signals and generating a differential signal, said electrical test probe comprising:
   (a) a first transmission line comprising a first signal conductor and a first ground conductor, said first transmission line having a characteristic impedance substantially equal to a first predetermined value;
   (b) a second transmission line comprising a second signal conductor and a second ground conductor, said second transmission line having a characteristic impedance substantially equal to a second predetermined value; and
   (c) a differential amplifier having a first signal input, a second signal input, and a ground input;
      (i) wherein a first input resistor is coupled between said first signal input and said ground input, said first input resistor having a resistive value substantially equal to said first predetermined value;
      (ii) wherein a second input resistor is coupled between said second signal input and said ground input, said second input resistor having a resistive value substantially equal to said second predetermined value;
      (iii) wherein a first end of said first signal conductor is coupled to said first signal input and a first end of said first ground conductor is coupled to said ground input;

(iv) wherein a first end of said second signal conductor is coupled to said second signal input and a first end of said second ground conductor is coupled to said ground input;

(v) wherein a second end of said first signal conductor is coupled to a first test point and a second end of said first ground conductor is floating; and (vi) wherein a second end of said second signal conductor is coupled to a second test point and a second end of said second ground conductor is floating.

2. The electrical test probe of claim 1, further comprising a first resistor coupled in series between said second end of said first signal conductor and the first test point, and a second resistor coupled in series between said second end of said second signal conductor and the second test point.

3. The electrical test probe of claim 1, wherein said first predetermined value is substantially equal to said second predetermined value.

4. The electrical test probe of claim 1, wherein said differential amplifier further comprises an amplifier output for generating a differential signal, a third transmission line, and a test instrument, wherein said amplifier output comprises a signal output and a ground output, and wherein a third transmission line comprises a third signal conductor and a third ground conductor, said third signal conductor being coupled between said amplifier output and a signal input of said test instrument and said third ground conductor being coupled between said ground output and a ground input of said test instrument.

5. A transmission line input structure for use with an electrical test probe, said electrical test probe for sensing a plurality of electric signals and generating a differential signal, said transmission line input structure comprising:

(a) a first transmission line comprising a first signal conductor and a first ground conductor, said first transmission line having a characteristic impedance substantially equal to a first predetermined value;

(b) a second transmission line comprising a second signal conductor and a second ground conductor, said second transmission line having a characteristic impedance substantially equal to a second predetermined value; and (c) a differential amplifier having a first signal input, a second signal input, and a ground input;
(i) wherein a first input resistor is coupled between said first signal input and said ground input, said first input resistor having a resistive value substantially equal to said first predetermined value;
(ii) wherein a second input resistor is coupled between said second signal input and said ground input, said second input resistor having a resistive value substantially equal to said second predetermined value;
(iii) wherein a first end of said first signal conductor is coupled to said first signal input and a first end of said first ground conductor is coupled to said ground input;
(iv) wherein a first end of said second signal conductor is coupled to said second signal input and a first end of said second ground conductor is coupled to said ground input;
(v) wherein a second end of said first signal conductor is coupled to a first test point and a second end of said first ground conductor is floating; and
(vi) wherein a second end of said second signal conductor is coupled to a second test point and a second end of said second ground conductor is floating.

6. The transmission line input structure of claim 5, further comprising a first resistor coupled in series between said second end of said first signal conductor and the first test point, and a second resistor coupled in series between said second end of said second signal conductor and the second test point.

7. The transmission line input structure of claim 5, wherein said first predetermined value is substantially equal to said second predetermined value.

8. The transmission line input structure of claim 5, wherein said differential amplifier further comprises an amplifier output for generating a differential signal, a third transmission line, and a test instrument, wherein said amplifier output comprises a signal output and a ground output, and wherein a third transmission line comprises a third signal conductor and a third ground conductor, said third signal conductor being coupled between said amplifier output and a signal input of said test instrument and said third ground conductor being coupled between said ground output and a ground input of said test instrument.

9. A method for sampling a plurality of electrical signals in a circuit and generating a differential signal, comprising:

(a) providing a first transmission line comprising a first signal conductor and a first ground conductor, said first transmission line having a characteristic impedance substantially equal to a first predetermined value;

(b) providing a second transmission line comprising a second signal conductor and a second ground conductor, said second transmission line having characteristic impedance substantially equal to a second predetermined value;

(c) providing a differential amplifier having a first input, a second input, and a ground input;
(i) wherein said first input comprises a first input resistor coupled between said first signal input and said ground input, said first input resistor having a resistive value substantially equal to said first predetermined value;
(ii) wherein said second input comprises a second input resistor coupled between said second signal input and said ground input, said second input resistor having a resistive value substantially equal to said second predetermined value;
(iii) wherein a first end of said first signal conductor is coupled to said first signal input and a first end of said first ground conductor is coupled to said ground input;
(iv) wherein a first end of second signal conductor is coupled to said second signal input and a first end of said second ground conductor is coupled to said ground input;

(d) coupling a second end of said first signal conductor to a first test point and allowing a second end of said first ground conductor to float; and (e) coupling a second end of said second signal conductor to a second test point and allowing a second end of said second ground conductor to float.

10. The method for sampling of claim 9, further comprising:

(a) providing an amplifier output, said amplifier output comprising a signal output and a ground output;

(b) providing a test instrument; and (c) providing a third transmission line, said third transmission line comprising a third signal conductor and a third ground conductor, said third signal conductor coupled between said amplifier output and a signal input of said test instrument and said third ground conductor coupled between said ground output and a ground input of said test instrument.

11. An electrical test probe for sensing a plurality of electric signals and generating a differential signal, said electrical test probe comprising:
(a) a first transmission line comprising a first signal conductor and a first ground conductor, said first transmission line having a characteristic impedance substantially equal to a first predetermined value;
(b) a second transmission line comprising a second signal conductor and a second ground conductor, said second transmission line having a characteristic impedance substantially equal to a second predetermined value; and
(c) a differential amplifier having a first signal input, a second signal input, and a ground input;
(i) wherein a first input resistor is coupled between said first signal input and said ground input, said first input resistor having a resistive value substantially equal to said first predetermined value;
(ii) wherein a second input resistor is coupled between said second signal input and said ground input, said second input resistor having a resistive value substantially equal to said second predetermined value;
(iii) wherein a first end of said first signal conductor is coupled to said first signal input and a first end of said first ground conductor is coupled to said ground input;
(iv) wherein a first end of said second signal conductor is coupled to said second signal input and a first end of said second ground conductor is coupled to said ground input;
(v) wherein a second end of said first signal conductor is coupled to a first test point; and
(vi) wherein a second end of said second signal conductor is coupled to a second test point.

12. The electrical test probe of claim 11, further comprising a first resistor coupled in series between said second end of said first signal conductor and the first test point, and a second resistor coupled in series between said second end of said second signal conductor and the second test point.

13. The electrical test probe of claim 11, wherein said first predetermined value is substantially equal to said second predetermined value.

14. The electrical test probe of claim 11, wherein said differential amplifier further comprises an amplifier output for generating a differential signal, a third transmission line, and a test instrument, wherein said amplifier output comprises a signal output and a ground output, and wherein a third transmission line comprises a third signal conductor and a third ground conductor, said third signal conductor being coupled between said amplifier output and a signal input of said test instrument and said third ground conductor being coupled between said ground output and a ground input of said test instrument.

15. A transmission line input structure for use with an electrical test probe, said electrical test probe for sensing a plurality of electric signals and generating a differential signal, said transmission line input structure comprising:
(a) a first transmission line comprising a first signal conductor and a first ground conductor, said first transmission line having a characteristic impedance substantially equal to a first predetermined value;
(b) a second transmission line comprising a second signal conductor and a second ground conductor, said second transmission line having a characteristic impedance substantially equal to a second predetermined value; and
(c) a differential amplifier having a first signal input, a second signal input, and a ground input;
(i) wherein a first input resistor is coupled between said first signal input and said ground input, said first input resistor having a resistive value substantially equal to said first predetermined value;
(ii) wherein a second input resistor is coupled between said second signal input and said ground input, said second input resistor having a resistive value substantially equal to said second predetermined value;
(iii) wherein a first end of said first signal conductor is coupled to said first signal input and a first end of said first ground conductor is coupled to said ground input;
(iv) wherein a first end of said second signal conductor is coupled to said second signal input and a first end of said second ground conductor is coupled to said ground input;
(v) wherein a second end of said first signal conductor is coupled to a first test point; and
(vi) wherein a second end of said second signal conductor is coupled to a second test point.

16. The transmission line input structure of claim 15, further comprising a first resistor coupled in series between said second end of said first signal conductor and the first test point, and a second resistor coupled in series between said second end of said second signal conductor and the second test point.

17. The transmission line input structure of claim 15, wherein said first predetermined value is substantially equal to said second predetermined value.

18. The transmission line input structure of claim 15, wherein said differential amplifier further comprises an amplifier output for generating a differential signal, a third transmission line, and a test instrument, wherein said amplifier output comprises a signal output and a ground output, and wherein a third transmission line comprises a third signal conductor and a third ground conductor, said third signal conductor being coupled between said amplifier output and a signal input of said test instrument and said third ground conductor being coupled between said ground output and a ground input of said test instrument.

19. A method for sampling a plurality of electrical signals in a circuit and generating a differential signal, comprising:
(a) providing a first transmission line comprising a first signal conductor and a first ground conductor, said first transmission line having a characteristic impedance substantially equal to a first predetermined value;
(b) providing a second transmission line comprising a second signal conductor and a second ground conductor, said second transmission line having characteristic impedance substantially equal to a second predetermined value;
(c) providing a differential amplifier having a first input, a second input, and a ground input;
(i) wherein said first input comprises a first input resistor coupled between said first signal input and said ground input, said first input resistor having a resistive value substantially equal to said first predetermined value;
(ii) wherein said second input comprises a second input resistor coupled between said second signal input and said ground input, said second input resistor having a resistive value substantially equal to said second predetermined value;
(iii) wherein a first end of said first signal conductor is coupled to said first signal input and a first end of said first ground conductor is coupled to said ground input;

(iv) wherein a first end of second signal conductor is coupled to said second signal input and a first end of said second ground conductor is coupled to said ground input;

(d) coupling a second end of said first signal conductor to a first test point; and (e) coupling a second end of said second signal conductor to a second test point.

20. The method for sampling of claim 19, further comprising:

(a) providing an amplifier output, said amplifier output comprising a signal output and a ground output;

(b) providing a test instrument; and (c) providing a third transmission line, said third transmission line comprising a third signal conductor and a third ground conductor, said third signal conductor coupled between said amplifier output and a signal input of said test instrument and said third ground conductor coupled between said ground output and a ground input of said test instrument.

21. An electrical test probe for sensing a plurality of electric signals and generating a differential signal, said electrical test probe comprising:

(a) a first transmission line comprising a first signal conductor and a first ground conductor, said first transmission line having a characteristic impedance substantially equal to a first predetermined value;

(b) a second transmission line comprising a second signal conductor and a second ground conductor, said second transmission line having a characteristic impedance substantially equal to a second predetermined value; and (c) a differential amplifier having a first signal input, a second signal input, and a ground input;

(i) wherein a first input resistor is coupled between said first signal input and said ground input, said first input resistor having a resistive value substantially equal to said first predetermined value;

(ii) wherein a second input resistor is coupled between said second signal input and said ground input, said second input resistor having a resistive value substantially equal to said second predetermined value;

(iii) wherein a first end of said first signal conductor is coupled to said first signal input and a first end of said first ground conductor is coupled to said ground input;

(iv) wherein a first end of said second signal conductor is coupled to said second signal input and a first end of said second ground conductor is coupled to said ground input;

(v) wherein a second end of said first signal conductor is coupled to a first test point and a second end of said first ground conductor is unreferenced with respect to ground; and (vi) wherein a second end of said second signal conductor is coupled to a second test point and a second end of said second ground conductor is unreferenced with respect to ground.

22. A transmission line input structure for use with an electrical test probe, said electrical test probe for sensing a plurality of electric signals and generating a differential signal, said transmission line input structure comprising:

(a) a first transmission line comprising a first signal conductor and a first ground conductor, said first transmission line having a characteristic impedance substantially equal to a first predetermined value;

(b) a second transmission line comprising a second signal conductor and a second ground conductor, said second transmission line having a characteristic impedance substantially equal to a second predetermined value; and (c) a differential amplifier having a first signal input, a second signal input, and a ground input;

(i) wherein a first input resistor is coupled between said first signal input and said ground input, said first input resistor having a resistive value substantially equal to said first predetermined value;

(ii) wherein a second input resistor is coupled between said second signal input and said ground input, said second input resistor having a resistive value substantially equal to said second predetermined value;

(iii) wherein a first end of said first signal conductor is coupled to said first signal input and a first end of said first ground conductor is coupled to said ground input;

(iv) wherein a first end of said second signal conductor is coupled to said second signal input and a first end of said second ground conductor is coupled to said ground input;

(v) wherein a second end of said first signal conductor is coupled to a first test point and a second end of said first ground conductor is unreferenced with respect to ground; and (vi) wherein a second end of said second signal conductor is coupled to a second test point and a second end of said second ground conductor is unreferenced with respect to ground.

23. A method for sampling a plurality of electrical signals in a circuit and generating a differential signal, comprising:

(a) providing a first transmission line comprising a first signal conductor and a first ground conductor, said first transmission line having a characteristic impedance substantially equal to a first predetermined value;

(b) providing a second transmission line comprising a second signal conductor and a second ground conductor, said second transmission line having characteristic impedance substantially equal to a second predetermined value;

(c) providing a differential amplifier having a first input, a second input, and a ground input;

(i) wherein said first input comprises a first input resistor coupled between said first signal input and said ground input, said first input resistor having a resistive value substantially equal to said first predetermined value;

(ii) wherein said second input comprises a second input resistor coupled between said second signal input and said ground input, said second input resistor having a resistive value substantially equal to said second predetermined value;

(iii) wherein a first end of said first signal conductor is coupled to said first signal input and a first end of said first ground conductor is coupled to said ground input; and (iv) wherein a first end of second signal conductor is coupled to said second signal input and a first end of said second ground conductor is coupled to said ground input;

(d) coupling a second end of said first signal conductor to a first test point and allowing a second end of said first ground conductor to be unreferenced with respect to ground; and (e) coupling a second end of said second signal conductor to a second test point and allowing a second end of said second ground conductor to be unreferenced with respect to ground.

24. An electrical test probe for sensing a plurality of electric signals and generating a differential signal, said electrical test probe comprising:
(a) a first transmission line comprising a first signal conductor and a first ground conductor, said first transmission line having a characteristic impedance substantially equal to a first predetermined value;
(b) a second transmission line comprising a second signal conductor and a second ground conductor, said second transmission line having a characteristic impedance substantially equal to a second predetermined value; and
(c) a differential amplifier having a first signal input, a second signal input, and a ground input;
  (i) wherein a first input resistor is coupled between said first signal input and said ground input, said first input resistor having a resistive value substantially equal to said first predetermined value;
  (ii) wherein a second input resistor is coupled between said second signal input and said ground input, said second input resistor having a resistive value substantially equal to said second predetermined value;
  (iii) wherein a first end of said first signal conductor is coupled to said first signal input and a first end of said first ground conductor is coupled to said ground input;
  (iv) wherein a first end of said second signal conductor is coupled to said second signal input and a first end of said second ground conductor is coupled to said ground input;
  (v) wherein a second end of said first signal conductor is coupled to a first test point;
  (vi) wherein a second end of said second signal conductor is coupled to a second test point; and
  (vii) wherein a second end of said first ground conductor and a second end of said second ground conductor do not have a common ground.

25. A transmission line input structure for use with an electrical test probe, said electrical test probe for sensing a plurality of electric signals and generating a differential signal, said transmission line input structure comprising:
(a) a first transmission line comprising a first signal conductor and a first ground conductor, said first transmission line having a characteristic impedance substantially equal to a first predetermined value;
(b) a second transmission line comprising a second signal conductor and a second ground conductor, said second transmission line having a characteristic impedance substantially equal to a second predetermined value; and
(c) a differential amplifier having a first signal input, a second signal input, and a ground input;
  (i) wherein a first input resistor is coupled between said first signal input and said ground input, said first input resistor having a resistive value substantially equal to said first predetermined value;
  (ii) wherein a second input resistor is coupled between said second signal input and said ground input, said second input resistor having a resistive value substantially equal to said second predetermined value;
  (iii) wherein a first end of said first signal conductor is coupled to said first signal input and a first end of said first ground conductor is coupled to said ground input;
  (iv) wherein a first end of said second signal conductor is coupled to said second signal input and a first end of said second ground conductor is coupled to said ground input;
  (v) wherein a second end of said first signal conductor is coupled to a first test point;
  (vi) wherein a second end of said second signal conductor is coupled to a second test point; and
  (vii) wherein a second end of said first ground conductor and a second end of said second ground conductor do not have a common ground.

26. A method for sampling a plurality of electrical signals in a circuit and generating a differential signal, comprising:
(a) providing a first transmission line comprising a first signal conductor and a first ground conductor, said first transmission line having a characteristic impedance substantially equal to a first predetermined value;
(b) providing a second transmission line comprising a second signal conductor and a second ground conductor, said second transmission line having characteristic impedance substantially equal to a second predetermined value;
(c) providing a differential amplifier having a first input, a second input, and a ground input;
  (i) wherein said first input comprises a first input resistor coupled between said first signal input and said ground input, said first input resistor having a resistive value substantially equal to said first predetermined value;
  (ii) wherein said second input comprises a second input resistor coupled between said second signal input and said ground input, said second input resistor having a resistive value substantially equal to said second predetermined value;
  (iii) wherein a first end of said first signal conductor is coupled to said first signal input;
  (iv) wherein a first end of second signal conductor is coupled to said second signal input; and
  (v) wherein a second end of said first ground conductor and a second end of said second ground conductor do not have a common ground;
(d) coupling a second end of said first signal conductor to a first test point and allowing a second end of said first ground conductor to be unreferenced with respect to ground; and
(e) coupling a second end of said second signal conductor to a second test point and allowing a second end of said second ground conductor to be unreferenced with respect to ground.

* * * * *

UNITED STATES PATENT AND TRADEMARK OFFICE
CERTIFICATE OF CORRECTION

PATENT NO.     : 6,822,463 B1
DATED          : November 23, 2004
INVENTOR(S)    : Jacobs It is certified that error appears in the above-identified patent and that said Letters Patent is hereby corrected as shown below:

Title page,
Item [56], References Cited, OTHER PUBLICATIONS, "Aglient Technologies, "Aglient EPM Series Power Meters E-Series and 8480 Series Power Sensors Data Sheet," at least as early as Oct. 24, 2003, pp. 1-22, www.aglient.com." should read -- Agilent Technologies, "Agilent EPM Series Power Meters E-Series and 8480 Series Power Sensors Data Sheet," at least as early as Oct. 24, 2003, pp. 1-22, www.agilent.com. --.

Column 3,
Line 62, "C, to the signal" should read -- $C_1$ to the signal --.

Column 4,
Line 13, "C, declines to zero" should read -- $C_1$ declines to zero --.

Column 5,
Line 49, "relative the wavelength" should read -- relative to the wavelength --.

Column 6,
Line 18, "second resistor $R_{L-}$ the" should read -- second resistor $R_{L-}$, the --.
Line 57, "cable 124 has" should read -- cable 124 has a --.

Column 7,
Line 9, "the first resistor $R_{L-}$" should read -- the first resistor $R_{l+}$ --.
Line 41, "to be as dose" should read -- to be as close --.

Column 10,
Line 46, "a first end of second" should read -- a first end of said second --.

Column 13,
Line 1, "a first end of second" should read -- a first end of said second --.

Column 14,
Line 59, "a first end of second" should read -- a first end of said second --.

UNITED STATES PATENT AND TRADEMARK OFFICE
CERTIFICATE OF CORRECTION

PATENT NO. : 6,822,463 B1
DATED : November 23, 2004
INVENTOR(S) : Jacobs

It is certified that error appears in the above-identified patent and that said Letters Patent is hereby corrected as shown below:

Column 16,
Line 45, "a first end of second" should read -- a first end of said second --.

Signed and Sealed this

Twenty-second Day of November, 2005

JON W. DUDAS
*Director of the United States Patent and Trademark Office*